United States Patent
Winkler et al.

(10) Patent No.: US 9,045,687 B2
(45) Date of Patent: Jun. 2, 2015

(54) CARBODIIMIDE PHOSPHORS

(75) Inventors: Holger Winkler, Darmstadt (DE); Andreas Benker, Lautertal (DE); Ralf Petry, Griesheim (DE); Tim Vosgroene, Ober-Ramstadt (DE)

(73) Assignee: MERCK PATENT GMBH, Darmstadt (DE)

(*) Notice: Subject to any disclaimer, the term of this patent is extended or adjusted under 35 U.S.C. 154(b) by 286 days.

(21) Appl. No.: 13/811,428

(22) PCT Filed: Jun. 24, 2011

(86) PCT No.: PCT/EP2011/003130
§ 371 (c)(1),
(2), (4) Date: Jan. 22, 2013

(87) PCT Pub. No.: WO2012/010243
PCT Pub. Date: Jan. 26, 2012

(65) Prior Publication Data
US 2013/0121014 A1  May 16, 2013

(30) Foreign Application Priority Data
Jul. 22, 2010 (DE) .......................... 10 2010 031 914

(51) Int. Cl.
*C09K 11/77* (2006.01)
*C09K 11/65* (2006.01)
*C01B 21/082* (2006.01)
*C09K 11/08* (2006.01)
*H05B 33/14* (2006.01)
*F21V 9/16* (2006.01)
*G09F 13/20* (2006.01)
*H01L 33/50* (2010.01)

(52) U.S. Cl.
CPC ........... *C09K 11/7731* (2013.01); *C09K 11/655* (2013.01); *C01B 21/0828* (2013.01); *C01P 2002/54* (2013.01); *C01P 2002/84* (2013.01); *C01P 2006/60* (2013.01); *C09K 11/0883* (2013.01); *C09K 11/7734* (2013.01); *H01L 33/504* (2013.01); *H05B 33/14* (2013.01); *F21V 9/16* (2013.01); *G09F 13/20* (2013.01)

(58) Field of Classification Search
CPC ......................... C09K 11/665; C09K 11/7734
USPC ..................................... 252/301.4 F
See application file for complete search history.

(56) References Cited

U.S. PATENT DOCUMENTS

2010/0213489 A1* 8/2010 Kim et al. ...................... 257/98

OTHER PUBLICATIONS

Krings.r-SrNCN:Eu2+—A Novel Efficient Orange-Emitting Phosphor. Chem. Mater. 2011, 23, 1694-1699.*
Glaser, J. et al., "Crystal Structures, Phase-Transitions, and Photoluminescence of rare Earth Carbodiimides," Inorganic Chemistry, 2008, vol. 47, pp. 10455-10460.

(Continued)

*Primary Examiner* — Matthew E Hoban
(74) *Attorney, Agent, or Firm* — Millen, White, Zelano, Branigan, P.C.

(57) ABSTRACT

The invention relates to carbodiimide compounds of the general formula (I) $EA_{2-y}Si(CN_2)_{4-x}O_x:Eu_y$ where EA stands for one or more elements selected from Mg, Ca, Sr, Ba or Zn and x stands for a value from the range from 0 to 3.9 and Y stands for a value from the range from 0.01 to 0.4, and a process for the preparation of these phosphors and the use thereof as conversion phosphors or in lamps.

21 Claims, 3 Drawing Sheets

(56) References Cited

OTHER PUBLICATIONS

Glaser, J. et al., "Multilaterial solid-state metatheis reactions for the preparation of materials with heteroanions: The $[Si(CN_2)_4]^{4-}$ Ion," Angew. Chem. Int. Ed., 2008, vol. 47, pp. 7547-7550.

Glaser, J. et al., "Synthesis and properties of tetracyanamidosilicates ARE[$Si(CN_2)_4$]" Inorg. Chem., 2010, vol. 49, pp. 2954-2959.

International Search Report for PCT/EP2011/003130, Date of the actual completion of the international search: Sep. 8, 2011, Date of mailing of the international search: Sep. 27, 2011.

Meyer, H. J. et al., "Solid state metathesis reactions as a conceptual tool in the synthesis of new materials," Dalton Trans., 2010, vol. 39, pp. 5973-5982.

Pagano, S. et al., "$Ba_6Si_6N_{10}O_2(CN_2)$—A Nitridosilicate with a NPO-Zeolite Structure Type Containing Carbodiimide Ions," Eur. J. Inorg. Chem., 2009, pp. 2678-2683.

Sindlinger, J. et al., "Synthesis of $Y_2O_2(CN_2)$ and Luminescence Properties of $Y_2O_2(CN_2)$:Eu," Z. Anorg. Allg. Chem., 2007, vol. 633, pp. 1686-1690.

* cited by examiner

CARBODIIMIDE PHOSPHORS

The invention relates to carbodiimide compounds, a process for the preparation of these compounds and the use thereof as conversion phosphors or in lamps.

LEDs are increasing in importance—both as lighting and also on use as backlighting in liquid-crystal displays (LC displays). These novel light sources have a number of advantages over conventional cold-cathode fluorescent lamps (CCFLs), such as a longer lifetime, potential energy saving, absence of harmful contents (such as mercury in CCFLs).

In recent years, an increasing number of papers have been published which relate to carbodiimide-based phosphors. Specifically, these are compounds which contain the carbodiimide anion $(CN_2)^{2-}$ as central unit and may be doped with $Ce^{3+}$, $Eu^{3+}$ or $Tb^{3+}$. Examples thereof are $Gd_2(CN_2)_3:Ce^{3+}$ and $Gd_2(CN_2)_3:Tb^{3+}$ (J. Glaser et al., Inorg. Chem. 2008, 47, 10455-10460 and $Y_2O_2(CN_2):Eu^{3+}$ (J. Sindlinger et al., Z. Anorg. Allg. Chem. 2007, 633, 1686-1690).

However, the disadvantage of the said phosphors consists in that they cannot be excited at the emission wavelength of blue LEDs (i.e. 440-460 nm), which is why they are not suitable as phosphors for white-light LEDs. Furthermore, so-called silicocarbodiimides are known (J. Glaser and H.-J. Meyer, Angew. Chem. 2008, 120, 7658-7661), which have hitherto only been available in undoped form and are thus not suitable as phosphors.

Surprisingly, it has now been found that Eu-doped compounds which are structurally analogous to orthosilicates are efficient phosphors which can be excited in the blue and UV region of the visible spectrum to produce green to red fluorescence.

A first embodiment of the present invention is therefore a compound of the formula I,

$$EA_{2-y}Si(CN_2)_{4-x}O_x:Eu_y \qquad (I)$$

where

EA stands for one or more elements selected from Mg, Ca, Sr, Ba or Zn and x stands for a value from the range from 0 to 3.9 and y stands for a value from the range from 0.01 to 0.4.

In contrast to orthosilicate phosphors, these compounds, which can be referred to as alkaline-earth metal silicocarbodiimides, are not unstable to moisture. In addition, the phosphors according to the invention exhibit a red shift of the emission wavelength compared with orthosilicates, which is due to the somewhat higher covalence of the carbodiimide group compared with oxygen.

x preferably stands for a value from the range 0 to 3.0 and particularly preferably from the range 0 to 2.5.

y preferably stands for a value from the range 0.02 to 0.35 and particularly preferably from the range 0.04 to 0.30.

In a further embodiment, the compounds of the formula I may additionally contain alkali metals, such as Na, K or Li.

Phosphors according to the invention give rise to good LED qualities even when employed in small amounts. The LED quality is described here via conventional parameters, such as, for example, the colour rendering index or the colour point in CIE x and CIE y coordinates.

The colour rendering index or CRI is a dimensionless lighting quantity, familiar to the person skilled in the art, which compares the colour reproduction faithfulness of an artificial light source with that of sunlight and/or filament light sources (the latter two have a CRI of 100).

CIE x and CIE y stand for the coordinates in the standard CIE colour chart (here standard observer 1931), familiar to the to the person skilled in the art, by means of which the colour of a light source is described.

All the quantities mentioned above are calculated from emission spectra of the light source by methods familiar to the person skilled in the art.

In the context of this application, green emission or green light denotes light whose intensity maximum is at a wavelength between 508 nm and 550 nm; correspondingly, yellow denotes light whose maximum is at a wavelength between 551 nm and 585 nm, and red denotes light whose maximum is at a wavelength between 610 nm and 670 nm.

The invention furthermore relates to a process for the preparation of a compound of the formula I.

To this end, in a step a), at least 3 starting materials selected from calcium-, strontium-, barium-, magnesium-, zinc-, silicon- and/or europium-containing materials are mixed, and, in step b), an inorganic or organic substance is optionally added to the mixture, and then, in a step c), the mixture is subjected to thermal aftertreatment, preferably under reducing conditions.

The above-mentioned thermal treatment is preferably carried out at least partly under reducing conditions. In step b), the reaction is usually carried out at a temperature above 800° C, preferably at a temperature above 1000° C. and particularly preferably in the range 1100° C.-1300° C. The reducing conditions here are established, for example, using carbon monoxide, forming gas or hydrogen or at least vacuum or an oxygen-deficient atmosphere, preferably in a stream of nitrogen, preferably in a stream of $N_2/H_2$ and particularly preferably in a stream of $N_2/H_2$ (95-80:5-20).

The inorganic or organic substance employed (in step b) is a substance from the group of ammonium halides, preferably ammonium chloride, or alkaline-earth metal fluorides, such as calcium fluoride, strontium fluoride or barium fluoride, or fluxing agents, such as borates, boric acid or alcoholates, oxalates and/or silicates, such as tetraethyl orthosilicate (TEOS).

In a further embodiment, the phosphor may additionally comprise at least one further phosphor material from the following:

oxides, molybdates, tungstates, vanadates, garnets, silicates, aluminates, nitrides and oxynitrides, in each case individually or mixtures thereof with one or more activator ions, such as Ce, Eu, Mn, Cr and/or Bi. This is particularly advantageous if certain colour spaces are to be established.

The absorption and emission spectrum, the thermal extinction behaviour and the decay time $\tau_{1/e}$ of luminescent materials of the formula I are highly dependent on the precise composition of the divalent cations. The crucial factor for the above-mentioned spectroscopic properties is the crystal field splitting of the 5d band of $Eu^{2+}$ and the covalent character of the Eu—O or Eu—N—C bonds.

The particle size of the phosphors according to the invention is usually between 50 nm and 30 µm, preferably between 1 µm and 20 µm.

In a further preferred embodiment, the phosphors in particle form have a continuous surface coating consisting of $SiO_2$, $TiO_2$, $Al_2O_3$, ZnO, $ZrO_2$ and/or $Y_2O_3$ or mixed oxides thereof. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the chip. This heat results in a reduction in the fluorescence light yield of the phosphor and may also influence the colour of the fluorescence light. Finally, a coating of this type enables the efficiency of the phosphor to be increased by preventing lattice vibrations arising in the phosphor from propagating to the environment.

In addition, it is preferred for the phosphors to have a porous surface coating consisting of $SiO_2$, $TiO_2$, $Al_2O_3$, ZnO, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described in WO 03/027015, which is incorporated in its full scope into the context of the present application by way of reference: the etching of glass (for example soda-lime glasses (see U.S. Pat. No. 4,019,884)), the application of a porous layer, and the combination of a porous layer and an etching operation.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

Since the phosphor layer according to the invention applied to the LED chip preferably consists of a mixture of silicone and homogeneous phosphor particles which is applied by bulk casting, and the silicone has a surface tension, this phosphor layer is not uniform at a microscopic level or the thickness of the layer is not constant throughout. This is generally also the case if the phosphor is not applied by the bulk-casting process, but instead in the so-called chip-level conversion process, in which a highly concentrated, thin phosphor layer is applied directly to the surface of the chip with the aid of electrostatic methods.

With the aid of the above-mentioned process, it is possible to produce any desired outer shapes of the phosphor particles, such as spherical particles, flakes and structured materials and ceramics.

The preparation of flake-form phosphors as a further preferred embodiment is carried out by conventional processes from the corresponding metal salts and/or rare-earth salts. The preparation process is described in detail in EP 763573 and DE 102006054331, which are incorporated in their full scope into the context of the present application by way of reference. These flake-form phosphors can be prepared by coating a natural or synthetically prepared, highly stable support or a substrate comprising, for example, mica, $SiO_2$, $Al_2O_3$, $ZrO_2$, glass or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from one material. If the flake itself merely serves as support for the phosphor coating, the latter must consist of a material which is transparent to the primary radiation of the LED, or absorbs the primary radiation and transfers this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 µm, preferably between 150 nm and 5 µm. The diameter here is 50 nm to 20 µm.

It generally has an aspect ratio (ratio of the diameter to the particle thickness) of 1:1 to 400:1 and in particular 3:1 to 100:1.

The flake dimensions (length×width) are dependent on the arrangement. Flakes are also suitable as centres of scattering within the conversion layer, in particular if they have particularly small dimensions.

The surface of the flake-form phosphor according to the invention facing the LED chip can be provided with a coating which has an antireflection action with respect to the primary radiation emitted by the LED chip. This results in a reduction in back-scattering of the primary radiation, enabling the latter to be coupled better into the phosphor body according to the invention.

Suitable for this purpose are, for example, coatings of matched refractive index, which must have a following thickness d: d=[wavelength of the primary radiation of the LED chip/(4*refractive index of the phosphor ceramic)], see, for example, Gerthsen, Physik [Physics], Springer Verlag, 18th Edition, 1995. This coating may also consist of photonic crystals, which also includes structuring of the surface of the flake-form phosphor in order to achieve certain functionalities.

The production of the phosphors according to the invention in the form of ceramic bodies is carried out analogously to the process described in DE 102006037730 (Merck), which is incorporated in its full scope into the context of the present application by way of reference. In this process, the phosphor is prepared by wet-chemical methods by mixing the corresponding starting materials and dopants, subsequently subjected to isostatic pressing and applied directly to the surface of the chip in the form of a homogeneous thin and non-porous flake. There is thus no location-dependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 µm. The flake dimensions (length×width) are dependent on the arrangement. In the case of direct application to the chip, the size of the flake should be selected in accordance with the chip dimensions (from about 100 µm*100 µm to several $mm^2$) with a certain oversize of about 10% to 30% of the chip surface with a suitable chip arrangement (for example flip-chip arrangement) or correspondingly. If the phosphor flake is installed over a finished LED, all of the exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, currentless metallisation processes are also suitable, see, for example, Hollemann-Wiberg, Lehrbuch der Anorganischen Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of an LED chip using a water-glass solution.

In a further embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are $2/3$ to $5/6$ of the melting point of the substance to be pressed.

In addition, the phosphors according to the invention can be excited over a broad range, extending from about 410 nm to 530 nm, preferably 430 nm to about 500 nm. These phosphors are thus not only suitable for excitation by UV- or blue-emitting light sources, such as LEDs or conventional discharge lamps (for example based on Hg), but also for light sources such as those which utilise the blue $In^{3+}$ line at 451 nm.

The present invention furthermore relates to a light source, characterised in that the latter comprises a semiconductor and at least one phosphor of the formula I. This lighting unit is preferably white-emitting or emits light having a certain colour point (colour-on-demand principle).

The colour-on-demand concept is taken to mean the production of light having a certain colour point using a pcLED (=phosphor-converted LED) using one or more phosphors. This concept is used, for example, in order to produce certain corporate designs, for example for illuminated company logos, trademarks, etc.

In a preferred embodiment of the light source according to the invention, the semiconductor is a luminescent indium aluminium gallium nitride, in particular of the formula

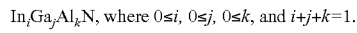

$In_iGa_jAl_kN$, where $0 \leq i$, $0 \leq j$, $0 \leq k$, and $i+j+k=1$.

In a further preferred embodiment of the light source according to the invention, the light source is a luminescent arrangement based on ZnO, TCO (transparent conducting oxide), ZnSe or SiC or an arrangement based on an organic light-emitting layer (OLED).

In a further preferred embodiment of the light source according to the invention, the light source is a source which exhibits electroluminescence and/or photoluminescence. The light source may furthermore also be a plasma or discharge source.

Possible forms of light sources of this type are known to the person skilled in the art. These can be light-emitting LED chips of various structure.

The phosphors according to the invention can either be dispersed in a resin (for example epoxy or silicone resin) or, in the case of suitable size ratios, arranged directly on the light source or alternatively arranged remote therefrom, depending on the application (the latter arrangement also includes "remote phosphor technology"). The advantages of remote phosphor technology are known to the person skilled in the art and are revealed, for example, by the following publication: Japanese Journ. of Appl. Phys. Vol. 44, No. 21 (2005). L649-L651.

The invention furthermore relates to a lighting unit, in particular for the backlighting of display devices, which is characterised in that it comprises at least one light source described above, and to corresponding display devices, in particular liquid-crystal display devices (LC displays), having backlighting, which are characterised in that they comprise at least one lighting unit of this type.

Preference is furthermore given to a lighting unit, in particular for general lighting, which is characterised in that it has a CRI>60, preferably >70, more preferably >80. However, a CRI>80 can only be achieved in an LED if at least two carbodiimide phosphors according to the invention, for example from Examples 1, 2 and/or 3, are combined with one another.

In a further embodiment, it is preferred for the optical coupling of the lighting unit between the phosphor and the semiconductor to be achieved by a light-conducting arrangement.

This makes it possible for the semiconductor to be installed at a central location and to be optically coupled to the phosphor by means of light-conducting devices, such as, for example, optical fibres. In this way, it is possible to achieve lamps adapted to the lighting wishes which merely consist of one or various phosphors, which can be arranged to form a light screen, and an optical waveguide, which is coupled to the semiconductor. In this way, it is possible to place a strong light source at a location which is favourable for electrical installation and to install lamps comprising phosphors which are coupled to the optical waveguides at any desired locations without further electrical cabling, but instead only by laying optical waveguides.

The present invention furthermore relates to the use of the phosphors according to the invention for the partial or complete conversion of the blue or near-UV emission from a luminescent diode.

Preference is furthermore given to the use of the phosphors according to the invention for the conversion of the blue or near-UV emission into visible white radiation. Preference is furthermore given to the use of the phosphors according to the invention for the conversion of the primary radiation into a certain colour point in accordance with the "colour-on-demand" concept.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always in ° C. It furthermore goes without saying that, both in the description and also in the examples, the added amounts of the components in the compositions always add up to a total of 100%. Percentage data given should always be regarded in the given context. However, they usually always relate to the weight of the part-amount or total amount indicated.

Even without further comments, it is assumed that a person skilled in the art will be able to utilise the above description in its broadest scope. The preferred embodiments should therefore merely be regarded as descriptive disclosure which is absolutely not limiting in any way. The complete disclosure content of all applications and publications mentioned above and below is incorporated into this application by way of reference. The following examples are intended to illustrate the present invention. However, they should in no way be regarded as limiting. All compounds or components which can be used in the compositions are either known and commercially available or can be synthesised by known methods.

EXAMPLES

Example 1

Preparation of a Green-Emitting Phosphor
$Ba_{1.74}Sr_{0.18}Si(CN_2)_{1.92}O_{2.08}{:}Eu_{0.08}{}^{2+}$ 0.8 g of $NH_4Cl$ is added to 6.16 g of $Ba(CN_2)$, 0.46 g of $Sr(CN_2)$, 1.2 g of $SiO_2$ and 0.28 g of $Eu_2O_3$ and mixed thoroughly in a mortar. The resultant mixture is transferred into an oven, where it is calcined at 1200° C. for 6 hours under a nitrogen/hydrogen atmosphere (90:10). After cooling, the resultant phosphor is comminuted in a mortar mill and classified through a 20μ sieve.

CIE colour value determined: x=0.294; y=0.631

Example 2

Preparation of a Yellow-Emitting Phosphor
$Ba_{0.85}Sr_{1.05}Si(CN_2)_{1.9}O_{2.1}{:}Eu_{0.1}{}^{2+}$ 0.75 g of $NH_4Cl$ is added to 3.0 g of $Ba(CN_2)$, 2.68 g of $Sr(CN_2)$, 1.2 g of $SiO_2$ and 0.35 g of $Eu_2O_3$ and mixed thoroughly in a mortar. The resultant mixture is transferred into an oven, where it is calcined at 1200° C. for 6 hours under a nitrogen/hydrogen atmosphere (90:10). After cooling, the resultant phosphor is comminuted in a mortar mill and classified through a 20μ sieve.

CIE colour value determined: x=0.499; y=0.537

Example 3

Preparation of a Red-Emitting Phosphor $Sr_{1.0}Ca_{0.8}Si(CN_2)_{1.8}O_{2.2}{:}Eu_{0.2}{}^{2+}$ 0.6 g of $NH_4Cl$ is added to 2.54 g of $Sr(CN_2)$, 1.28 g of $Ca(CN_2)$ 1.2 g of $SiO_2$ and 0.70 g of $Eu_2O_3$ and mixed thoroughly in a mortar. The resultant mixture is transferred into an oven, where it is calcined at 1200° C. for 6 hours under a nitrogen/hydrogen atmosphere (90:10). After cooling, the resultant phosphor is comminuted in a mortar mill and classified through a 20μ sieve.

CIE colour value determined: x=0.621; y=0.378

Example 4

Production of a Light-Emitting Diode

The phosphor from Example 1 is mixed with a 2-component silicone (OE 6550 from Dow Corning) in a tumble mixer in such a way that equal amounts of the phosphor are dispersed in the two components of the silicone; the total concentration of the phosphor in the silicone is 8% by weight.

5 ml of each of the two phosphor-containing silicone components are mixed homogeneously with one another and transferred into a dispenser. Empty LED packages from OSA optoelectronics, Berlin, which contain a 100 μm² GaN chip are filled with the aid of the dispenser. The LEDs are then placed in a heat chamber in order to solidify the silicone over 1 h at 150° C.

The emission spectrum of the LED according to Example 1 is indicated in FIG. 1.

CIE x and CIE y stand for the coordinates in the standard CIE colour chart (here standard observer 1931), familiar to the to the person skilled in the art, by means of which the colour of a light source is described.

All the quantities mentioned above are calculated from emission spectra of the light source by methods familiar to the person skilled in the art.

"CRI" stands for the so-called "colour rendering index", which is a dimensionless lighting quantity familiar to the person skilled in the art which compares the colour reproduction faithfulness of an artificial light source with that of sunlight and/or filament light sources (the latter two have a CRI of 100).

Figure 1:
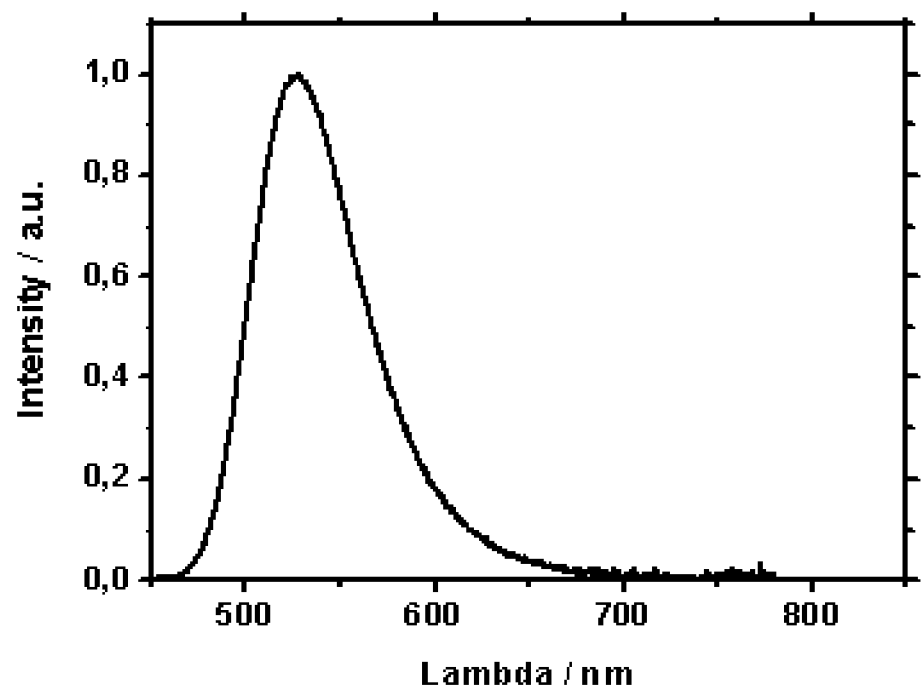
FIG. 1: The emission spectrum of the phosphor from Example 1 (peak at 530 nm). (The emission measurement was carried out on a layer of the phosphor with infinite optical thickness with excitation at 450 nm using an Edinburgh Instruments OC290 spectrometer at room temperature.)
Figure 2:
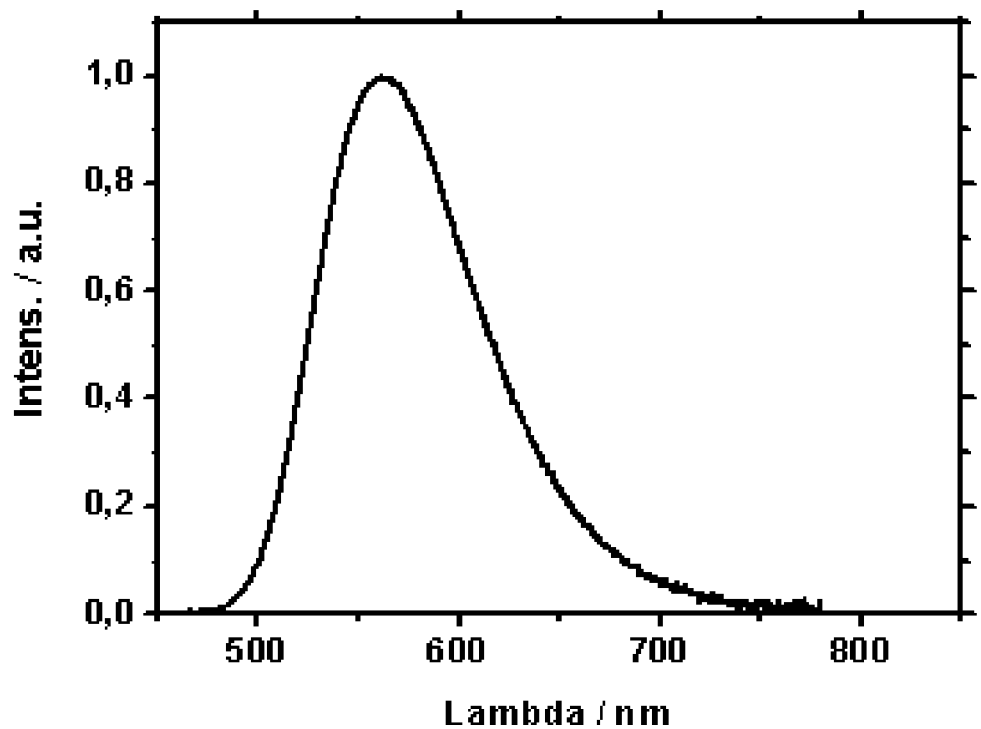
FIG. 2: The emission spectrum of the phosphor from Example 2 (peak at 560 nm). (The emission measurement was carried out on a layer of the phosphor with infinite optical thickness with excitation at 450 nm using an Edinburgh Instruments OC290 spectrometer at room temperature.)
Figure 3:
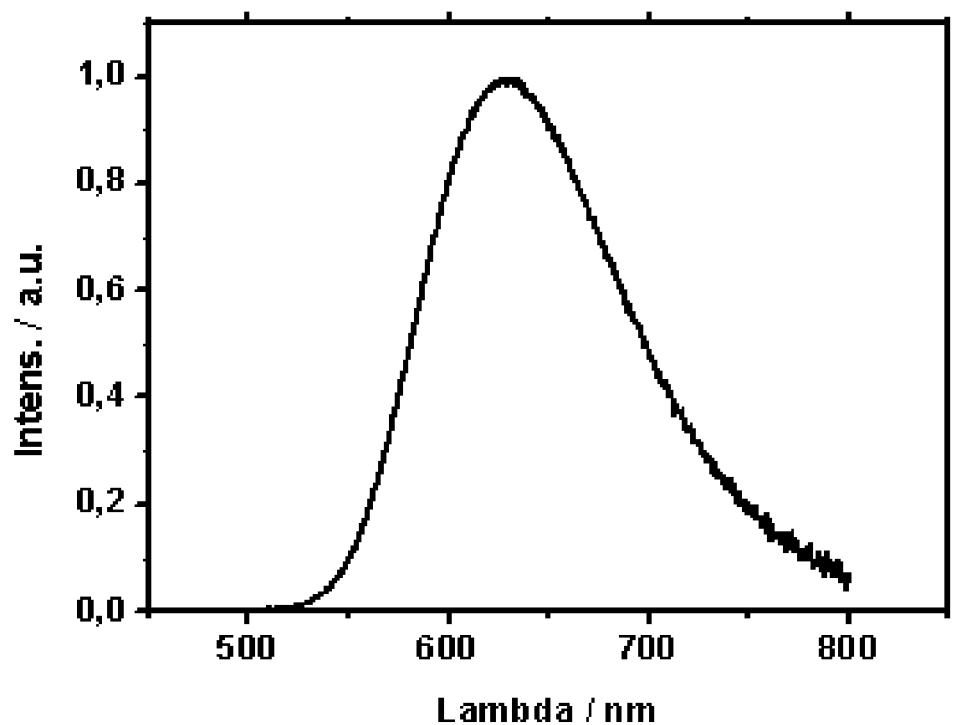
FIG. 3: The emission spectrum of the phosphor from Example 3 (peak at 630 nm). (The emission measurement was carried out on a layer of the phosphor with infinite optical thickness with excitation at 450 nm using an Edinburgh Instruments OC290 spectrometer at room temperature.)

The invention claimed is:
1. A compound of formula I

$$EA_{2-y}Si(CN_2)_{4-x}O_x{:}Eu_y \qquad (I)$$

where
EA stands for one or more elements selected from Mg, Ca, Sr, Ba, and Zn,
x stands for a value from the range from 0 to 3.9, and
y stands for a value from the range from 0.01 to 0.4.

2. A compound according to claim 1, wherein x stands for a value from the range from 0 to 3.0.

3. A compound according to claim 1, wherein y stands for a value from the range from 0.02 to 0.35.

4. A process for the preparation of a compound according to claim 1, said process comprising:

a) mixing of at least 3 starting materials selected from calcium-, strontium-, barium-, magnesium-, zinc-, silicon- and/or europium-containing materials,
b) optionally addition of at least one further inorganic or organic substance, and
c) thermal aftertreatment of the compound.

5. The process according to claim 4, wherein said at least one inorganic or organic substance is selected from ammonium halides, alkaline-earth metal fluorides, borates, boric acid, carbonates, alcoholates, oxalates and/or silicates.

6. A light source comprising at least one semiconductor and at least one phosphor, wherein said phosphor is a compound according to claim 1.

7. The light source according to claim 6, wherein the semiconductor is a luminescent indium aluminum gallium nitride.

8. A lighting unit comprising at least one light source according to claim 6.

9. The lighting unit according to claim 8, wherein optical coupling between the phosphor and the semiconductor is achieved by a light-conducting arrangement.

10. A display device having backlighting, wherein said display device comprises at least one lighting unit according to claim 8.

11. A method which comprises converting the blue or near-UV emission from a luminescent diode using a compound of claim 1 as a conversion phosphor.

12. A method which comprises converting primary radiation into a certain color point in accordance with the color-on-demand concept using a compound of claim 1 as a conversion phosphor.

13. A compound according to claim 1, wherein x stands for a value from the range from 0 to 2.5.

14. A compound according to claim 1, wherein y stands for a value from the range from 0.04 to 0.30.

15. The process according to claim 5, wherein said at least one inorganic or organic substance is selected from ammonium chloride, calcium fluoride, strontium fluoride, barium fluoride, borates, boric acid, ammonium hydrogencarbonate, and tetraethyl orthosilicate.

16. The light source according to claim 7, wherein said luminescent indium aluminum gallium nitride is of the formula $In_iGa_jAl_kN$, where $0 \le i$, $0 \le j$, $0 \le k$, and $i+j+k=1$.

17. The lighting unit according to claim 8, wherein said unit is for the backlighting of display devices.

18. The display device according to claim 8, wherein said device is a liquid-crystal display device.

19. A compound according to claim 1, wherein said compound is $Ba_{1.74}Sr_{0.18}Si(CN_2)_{1.92}O_{2.08}:Eu_{0.08}^{2+}$.

20. A compound according to claim 1, wherein said compound is $Ba_{0.85}Sr_{1.05}Si(CN_2)_{1.9}O_{2.1}:Eu_{0.1}^{2+}$.

21. A compound according to claim 1, wherein said compound is $Sr_{1.0}Ca_{0.8}Si(CN_2)_{1.8}O_{2.2}:Eu_{0.2}^{2+}$.

* * * * *